United States Patent
Sato

(10) Patent No.: US 6,784,704 B2
(45) Date of Patent: Aug. 31, 2004

(54) SEMICONDUCTOR INTEGRATED CIRCUIT HAVING CIRCUIT FOR CHANGING TIMING OF INACTIVATING POWER-ON RESETTING CIRCUIT

(75) Inventor: Takahiko Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/843,820

(22) Filed: Apr. 30, 2001

(65) Prior Publication Data

US 2001/0048328 A1 Dec. 6, 2001

(30) Foreign Application Priority Data

Jun. 1, 2000 (JP) ......................................... 2000-164442

(51) Int. Cl.[7] .................................................. H03L 7/00
(52) U.S. Cl. ...................... 327/143; 327/198; 327/538; 327/540; 323/313
(58) Field of Search ................................. 327/143, 198, 327/138, 540, 525, 526, 142, 538, 541, 543; 323/313, 315

(56) References Cited

U.S. PATENT DOCUMENTS

| | | | | |
|---|---|---|---|---|
| 4,900,950 A | * | 2/1990 | Dubujet | 327/143 |
| 5,365,481 A | * | 11/1994 | Sawada | 365/201 |
| 5,389,843 A | * | 2/1995 | McKinney | 327/276 |
| 5,994,888 A | * | 11/1999 | Yanagawa | 327/143 |
| 6,005,423 A | * | 12/1999 | Schultz | 327/143 |
| 6,014,221 A | * | 1/2000 | Hoon | 327/143 |
| 6,040,722 A | * | 3/2000 | Lee | 327/143 |
| 6,229,367 B1 | * | 5/2001 | Choudhury | 327/276 |
| 6,469,551 B2 | * | 10/2002 | Kobayashi et al. | 327/143 |

* cited by examiner

*Primary Examiner*—Timothy P. Callahan
*Assistant Examiner*—An T. Luu
(74) *Attorney, Agent, or Firm*—Arent Fox, PLLC.

(57) ABSTRACT

The semiconductor integrated circuit has a power-on resetting circuit for activating a reset signal which initializes an internal circuit, for a predetermined period after a power supply is switched on, and then inactivating the reset signal. The inactivation timing of the reset signal is changed by a timing changing circuit. Therefore, the inactivation timing which has deviated due to fluctuations in the manufacturing conditions of the semiconductor integrated circuit can be adjusted to a normal value. This consequently allows reliable initialization of the internal circuit. In general, a power-on resetting circuit utilizes the threshold voltage of transistors to generate the reset signal. Here, the inactivation timing depends on the threshold voltage of the transistors. Changing the inactivation timing corresponding to the threshold voltage of the transistors implemented makes it possible that the timing changing circuit optimally adjusts the inactivation timing of the reset signal.

12 Claims, 6 Drawing Sheets

SEMICONDUCTOR INTEGRATED CIRCUIT HAVING CIRCUIT FOR CHANGING TIMING OF INACTIVATING POWER-ON RESETTING CIRCUIT

BACKGROUND OF THE INVENTION

1. Field of the Invention

The present invention relates to a semiconductor integrated circuit having a power-on resetting circuit.

2. Description of the Related Art

In general, semiconductor integrated circuits implement a power-on resetting circuit. When the power supply is switched on, the power-on resetting circuit is operated to initialize internal circuits, which avoids malfunctions of the semiconductor integrated circuit.

FIG. 1 shows the waveform of a power-on resetting signal POR which a power-on resetting circuit of this type generates. Hereinafter, the power-on resetting signal POR will be sometimes simply referred to as reset signal POR.

When an external supply voltage VCC starts being supplied to the semiconductor integrated circuit, the reset signal POR follows the external supply voltage VCC to rise in level for a predetermined period, and then changes to low level (inactivation). Internal circuits necessary to be initialized in the semiconductor integrated circuit are initialized during a period T1 from the supply voltage VCC reaching a predetermined value to the reset signal POR being inactivated. Then, the inactivation (low level) of the reset signal POR terminates the reset operation, whereby the internal circuits start their normal operations.

This kind of power-on resetting circuit typically utilizes threshold voltage of a transistor to detect the rise of the supply voltage VCC up to the predetermined value and inactivate the reset signal POR.

Recently, semiconductor integrated circuits have lowered in operation voltage. The supply voltage VCC supplied from exterior has also lowered. The threshold voltage of the transistor has little dependence on the supply voltage VCC, and thus the ratio of the threshold voltage of the transistor to the supply voltage VCC becomes higher. As a result, power-on resetting circuits vary greatly in the detection level of the supply voltage VCC, due to fluctuations in the threshold voltage. The amount of deviation (T2 in FIG. 1) in the inactivation timing of the reset signal POR has a greater effect on the variations of the threshold voltage than in higher operation voltage. The threshold voltage of the transistor fluctuates with variations in the manufacturing conditions of the semiconductor integrated circuit, as well as the position of the chip on the wafer and the position of the wafer in the manufacturing lot.

For example, when the inactivation timing of the reset signal POR advances, the reset period T1 will be short. This may hamper normal initialization of the internal circuits. At the worst, the high-level period of the reset signal POR, necessary for initializing internal circuit, might be almost none. Meanwhile, when the inactivation timing of the reset signal POR delays, the reset signal POR might not be inactivated (kept high level). Furthermore, when the inactivating timing of the reset signal POR is inappropriate, transient fluctuations in the supply voltage VCC or the ground voltage possibly cause the power-on resetting circuit to malfunction, thereby activating the reset signal POR temporarily.

Moreover, in the cases of directly measuring the inactivation timing of the reset signal POR, the inactivation timing substantially varies due to a contact with a tester probe. In order to avoid this, it is necessary to add an output element (testing circuit), which requires an additional layout area. Besides, the evaluation by using a testing circuit is generally performed after semiconductor integrated circuits are entered into a test mode. However, the presence of the circuits to be initialized by the reset signal POR on the signal path related to the testing circuit makes the entering to the test mode impossible, thereby precluding the evaluation itself.

SUMMARY OF THE INVENTION

An object of the present invention is to reduce variations in the inactivation timing of the reset signal generated by the power-on resetting circuit.

Another object of the present invention is to operate the power-on resetting circuit with reliability and initialize an internal circuit even when the external supply voltage is low.

According to one aspect of the present invention, a semiconductor integrated circuit has a power-on resetting circuit for activating a reset signal which initializes an internal circuit, for a predetermined period after a power supply is switched on, and then inactivating the reset signal. The inactivation timing of the reset signal is changed by a timing changing circuit. Therefore, the inactivation timing which has deviated due to fluctuations in the manufacturing conditions of the semiconductor integrated circuit can be adjusted to a normal value. This consequently allows reliable initialization of the internal circuit.

According to another aspect of the present invention, the inactivation timing is changed corresponding to a threshold voltage of transistors implemented in the internal circuit. In general, the power-on resetting circuit utilizes the threshold voltage of the transistors to generate the reset signal. Here, the inactivation timing depends on the threshold voltage. Changing the inactivation timing corresponding to the threshold voltage of the transistors implemented makes it possible that the timing changing circuit optimally adjusts the inactivation timing of the reset signal. That is, the inactivation timing can be optimized based on the threshold voltage.

Even when a supply voltage supplied from exterior is low, and the ratio of the threshold voltage of the transistors to the supply voltage is high, the power-on resetting circuit operates with reliability to generate the reset signal. This allows initialization of the internal circuit.

According to another aspect of the semiconductor integrated circuit in the present invention, the semiconductor integrated circuit has a voltage generator for generating an internal supply voltage different from an external supply voltage in accordance with the external supply voltage supplied from exterior. The timing changing circuit easily changes the inactivation timing of the reset signal by utilizing the internal supply voltage which varies with a threshold voltage of transistors implemented in the voltage generator.

According to another aspect of the semiconductor integrated circuit in the present invention, the timing changing circuit has a programming circuit having a fuse. The inactivation timing of the reset signal is changed by programming the fuse in correspondence with the internal supply voltage. Once the inactivation timing is set, it will remain unchanged, therefore, the inactivation timing can be surely adjusted in the manufacturing process of the semiconductor integrated circuit.

According to another aspect of the semiconductor integrated circuit in the present invention, the semiconductor integrated circuit has a testing circuit for changing the internal supply voltage. Then, the fuse to be programmed is determined for the sake of optimizing the inactivation timing based on the operation of the testing circuit. For example, in the testing process of semiconductor integrated circuits, the testing circuit on each chip (semiconductor integrated circuit) is initially operated to check the optimum inactivation timing. Subsequently, the optimum inactivation timing can be set for each chip by programming the corresponding fuse.

According to another aspect of the semiconductor integrated circuit in the present invention, the internal supply voltage is adjusted to a predetermined value simultaneously with the change of the inactivation timing of the reset signal, by programming the fuse. This allows the fuse for setting the inactivation timing and the internal supply voltage to be shared when both the inactivation timing and the internal supply voltage depend on the threshold value. Fuses to be blown by laser beam irradiation require greater areas. Thus, the sharing of fuses is effective for a reduction in chip size.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, an embodiment of the present invention will be described with reference to the drawings.

Figure 1:
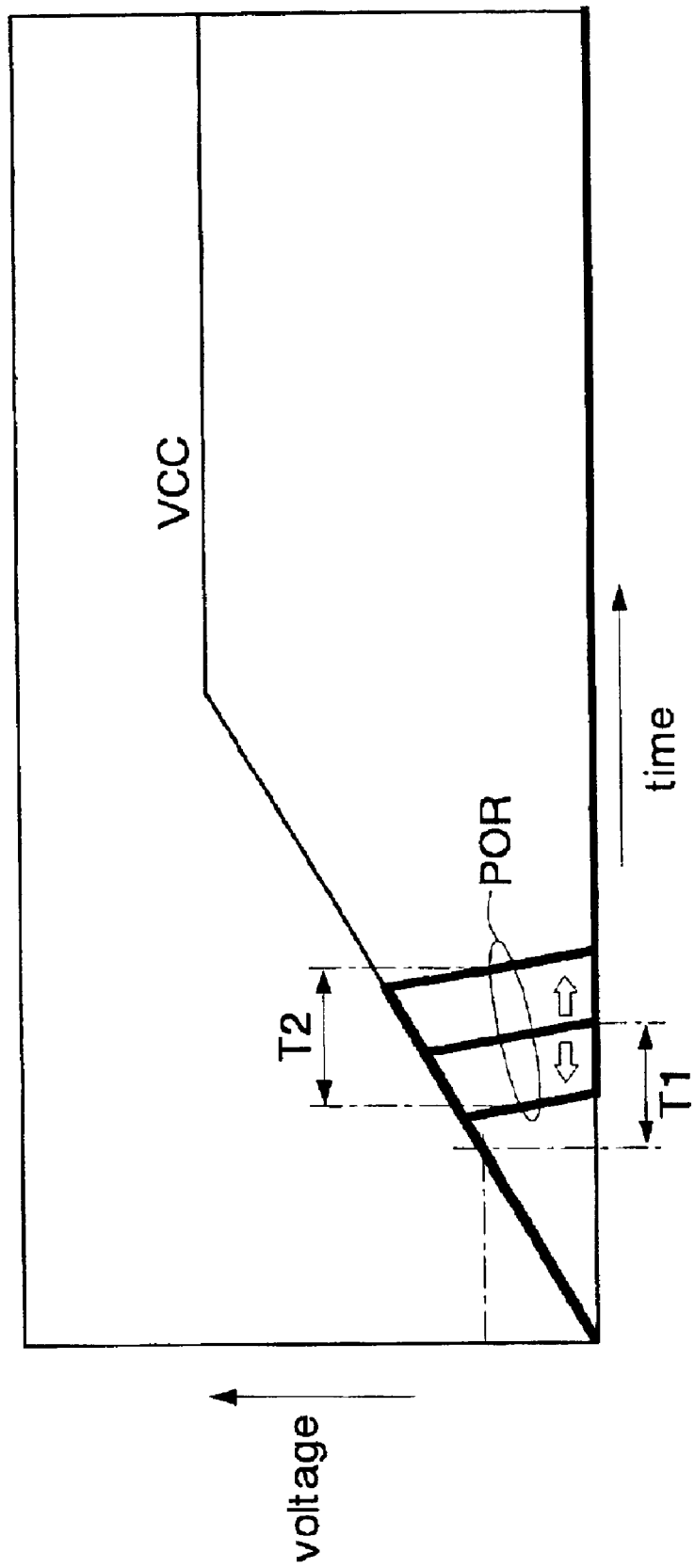
FIG. 1 is an explanatory diagram showing variations in the inactivation timing of the reset signal in the conventional art.
Figure 2:
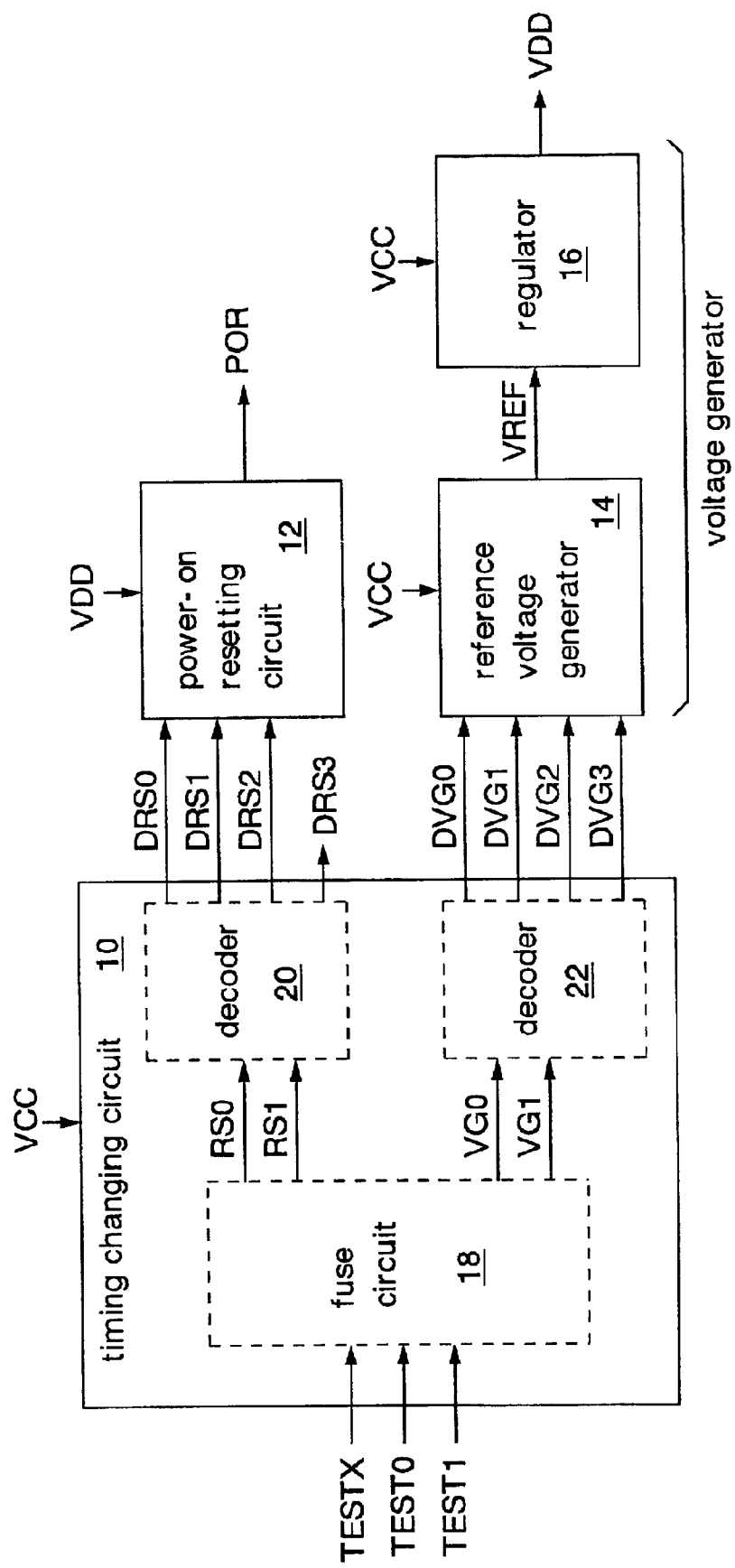
FIG. 2 is a block diagram showing an embodiment of the semiconductor integrated circuit in the present invention.

FIG. 2 shows an embodiment of the semiconductor integrated circuit in the present invention.

This semiconductor integrated circuit is formed on a silicon substrate as an SDRAM (Synchronous DRAM) by using CMOS processes.

The SDRAM has a timing changing circuit 10, a power-on resetting circuit 12, a reference voltage generator 14, and a regulator 16. Aside from those shown in the diagram, the SDRAM also includes input/output circuits, memory cores, control circuits for controlling the memory cores. The power-on resetting circuit 12 receives an internal supply voltage VDD as its power supply voltage. The timing changing circuit 10, the reference voltage generator 14, and the regulator 16 receive an external supply voltage VCC supplied from exterior as their power supply voltage. In the following description, a power supply line for supplying the internal supply voltage will be referred to as power supply line VDD. A power supply line for supplying the external supply voltage will be referred to as power supply line VCC.

The timing changing circuit 10 has a fuse circuit 18 and decoders 20, 22. The fuse circuit 18 receives a test activating signal TESTX and test signals TEST0, TEST1. In accordance with these signals, the fuse circuit 18 outputs adjusting signals VG0, VG1 to the decoder. In accordance with the states of the fuses implemented, the fuse circuit 18 outputs adjusting signals RS0, RS1 to the decoder 20. The decoder 20 receives the adjusting signals RS0 and RS1, and activates any one of decoding signals DRS0, DRS1, DRS2, and DRS3 in accordance with the signals received. The decoder 22 receives the adjusting signals VG0 and VG1, and activates any one of decoding signals DVG0, DVG1, DVG2, and DVG3 in accordance with the signals received.

The power-on resetting circuit 12 generates a power-on resetting signal POR. The inactivation timing of the reset signal POR can be changed in accordance with the decoding signals DRS0, DRS1, and DRS2. The reference voltage generator 14 generates a reference voltage VREF. The value of the reference voltage VREF can be changed in accordance with the decoding signals DVG0, DVG1, DVG2, and DVG3. The regulator 16 receives the reference voltage VREF, and generates the internal supply voltage VDD which has a predetermined drivability. The internal supply voltage VDD is supplied to the memory cores, the control circuits for controlling the memory cores, and so on.

Figure 3:
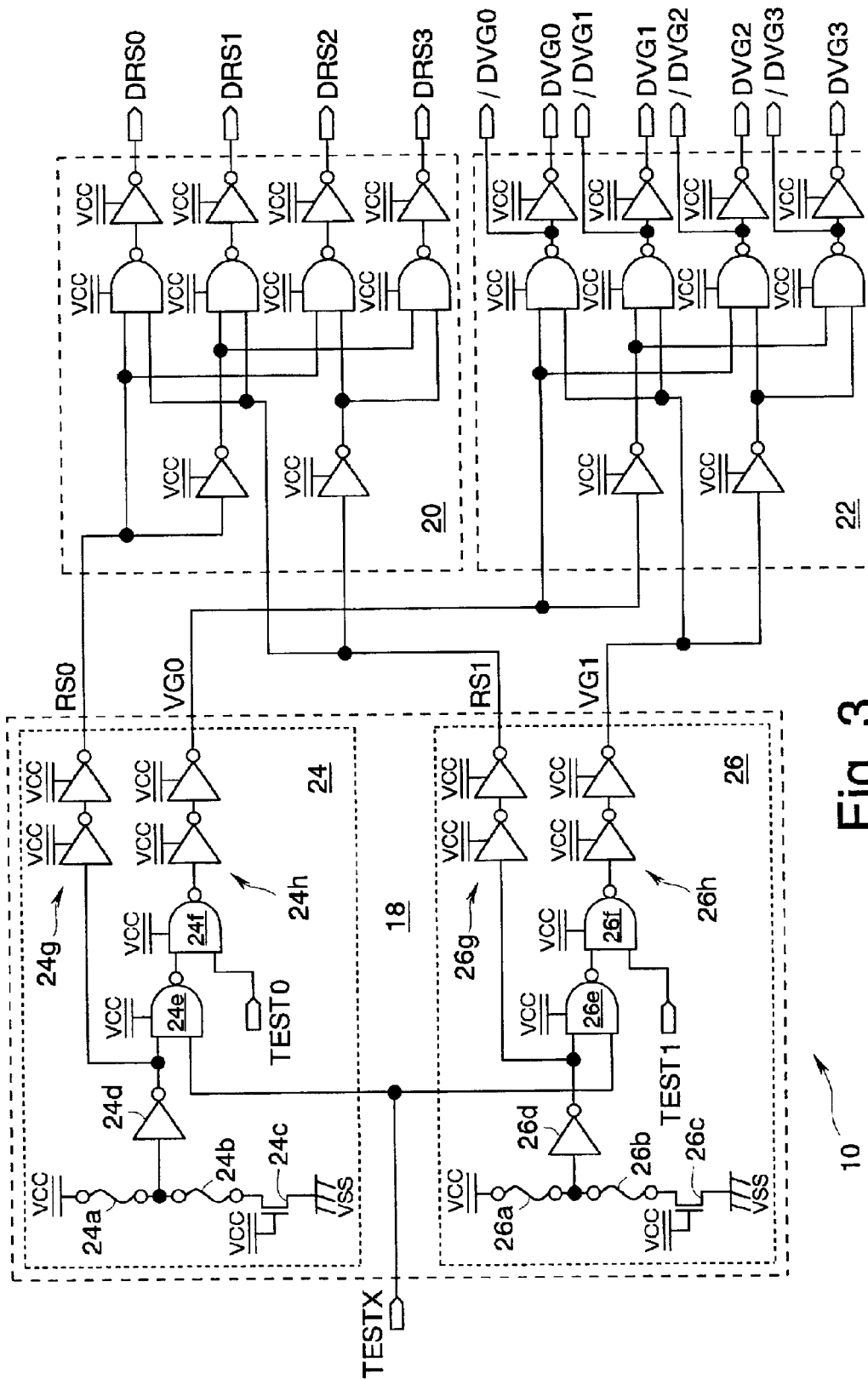
FIG. 3 is a circuit diagram showing a timing changing circuit in FIG. 2.

FIG. 3 shows the details of the fuse circuit 18 and the decoders 20, 22 in the timing changing circuit 10.

The fuse circuit 18 has a programming circuit 24 for generating the adjusting signals RS0 and VG0 which correspond to lower bits, and a programming circuit 26 for generating the adjusting signals RS1 and VG1 which correspond to upper bits. The programming circuit 24 includes a fuse 24a, a fuse 24b, an nMOS transistor 24c, an inverter 24d, NAND gates 24e and 24f, and inverter rows 24g and 24h each having a pair of inverters in cascade connection. In the following description, nMOS transistors and pMOS transistors will be simply referred to as nMOSs and pMOSs, respectively.

The fuse 24a, the fuse 24b, and the nMOS 24c are connected in series between the power supply line VCC and the ground line VSS. The nMOS 24c is connected to the power supply line VCC at its gate, thereby functioning as a resistor. The inverter 24d receives the levels of the connection nodes of the fuses 24a and 24b, and outputs a logical level (fuse information) corresponding to the states (blown or unblown) of the fuses 24a and 24b. The inverter row 24g receives the output of the inverter 24d to output the adjusting signal RS0.

The NAND gates 24e, 24f and the inverter row 24h are connected in series. The NAND gate 24e receives the output of the inverter 24d and the test activating signal TESTX. On receiving the inactivation (high level) of the test activating signal TESTX, the NAND gate 24e is activated to transmit the output of the inverter 24d (fuse information) to the NAND gate 24f. On receiving the activation (low level) of the test activating signal TESTX, the NAND gate 24e is inactivated to output high level. Here, no fuse information is transmitted. In test mode, the test activating signal TESTX is activated so that the fuse information is masked for the sake of evaluations of the internal supply voltage VDD. The NAND gate 24f receives the output of the NAND gate 24e and the test activating signal TEST0. In test mode, the test signal TEST0 is turned to high level so as to create a blown state of the fuse 24b shown in the lower part of the diagram. The test signal TEST0 is tuned to low level so as to create a blown state of the fuse 24a shown in the upper part of the diagram. The test signal TEST0 is also turned to high level in normal operation mode. That is, the NAND gate 24f transmits the information of the test signal TEST0 to the inverter row 24h in test mode, and transmits the fuse information to the inverter row 24h in normal operation mode. The inverter row 24h outputs the received information as the adjusting signal VG0. The inverter row 24g outputs the adjusting signal RS0.

The programming circuit 26 has the same configuration as that of the programming circuit 24. That is, a NAND gate 26e receives the test activating signal TESTX and the output of an inverter 26d. A NAND gate 26f receives the test signal TEST1. In test mode, the test signal TEST1 is turned to high level so as to create a blown state of a fuse 26b shown in the lower part of the diagram. The test signal TEST1 is tuned to low level so as to create a blown state of a fuse 26a shown in the upper part of the diagram. The test signal TEST1 is also turned to high level in normal operation mode. An inverter row 26h outputs the adjusting signal VG1. An inverter row 26g outputs the adjusting signal RS1.

As described above, the fuse circuit 18 also has a function of a testing circuit for setting the adjusting signals RS0, RS1, VG0, and VG1 at various levels to change the internal supply voltage VDD before blowing the fuses 24a, 24b, 26a, and 26b.

The decoder 20 includes four AND circuits consisting of NAND gates and inverters, and two inverters for supplying the inverted signals of the adjusting signals RS0 and RS1 to the NAND gates. The AND circuits receive the adjusting signals RS0, RS1 and the inverted signals thereof, and activate (high level) any one of the decoding signals DRS0, DRS1, DRS2, and DRS3 in accordance with the values of the adjusting signals RS0 and RS1. For example, when both the adjusting signals RS0 and RS1 are at high level, the decoding signal DRS0 is activated. When both the adjusting signal RS0 and RS1 are at low level, the decoding signal DRS3 is activated.

The decoder 22 is a circuit almost the same as the decoder 20. The AND circuits in the decoder 22 receive the adjusting signals VG0, VG1 and the inverted signals thereof. In accordance with the values of the adjusting signals VG0 and VG1, the AND circuits activate (high level) any one of the decoding signals DVG0, DVG1, DVG2, and DVG3, as well as activate (low level) any one of decoding signals /DVG0, /DVG1, /DVG2, and /DVG3. "/"s attached to the heads of the decoding signals represent negative logic. For example, when both the adjusting signals VG0 and VG1 are at high level, the decoding signals DVG0 and /DVG0 are activated. When both the adjusting signal VG0 and VG1 are at low level, the decoding signals DVG3 and /DVG3 are activated.

When the test activating signal TESTX is turned to low level in test mode, the NAND gates 24e and 24f in the programming circuit 24 are inactivated and activated, respectively. The NAND gates 26e and 26f in the programming circuit 26 are inactivated and activated, respectively. When the fuses 24a, 24b, 26a, and 26b are not blown, the inverter 24d in the programming circuit 24 and the inverter 26d in the programming circuit 26 output low level. Accordingly, the adjusting signals RS0 and RS1 both are turned to low level, which activates the decoding signal DRS3. In other words, all the decoding signals DRS0-DRS2 supplied to the power-on resetting circuit 12 are at low level.

Figure 4:
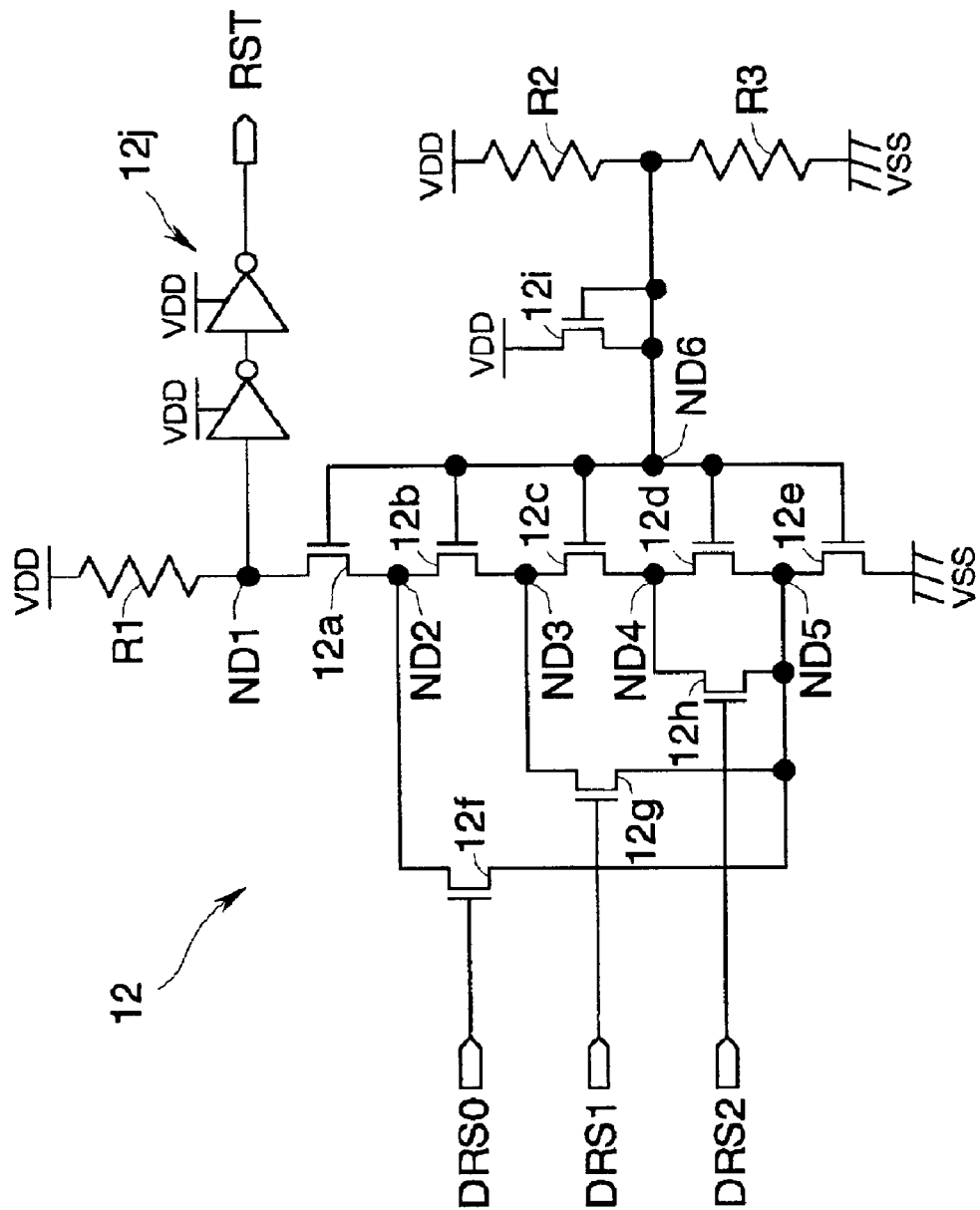
FIG. 4 is a circuit diagram showing a power-on resetting circuit in FIG. 2.

FIG. 4 shows the details of the power-on resetting circuit 12.

The power-on resetting circuit 12 includes nMOSs 12a, 12b, 12c, 12d, 12e, 12f, 12g, 12h, and 12i, resistors R1, R2, and R3, and an inverter row 12j having a pair of inverters in cascade connection.

The resistor R1 and the nMOSs 12a, 12b, 12c, 12d, and 12e are connected in series via nodes ND1, ND2, ND3, ND4, and ND5, between the power supply line VDD and the ground line VSS. The nMOSs 12f, 12g, and 12h establish connections from the node ND5 to the nodes ND2, ND3, and ND4, respectively. The gates of the nMOSs 12f, 12g, and 12h receive the decoding signals DRS0, DRS1, and DRS2, respectively. The nMOSs 12f, 12g, and 12h have a threshold voltage sufficiently lower than that of the nMOSs 12a, 12b, 12c, 12d, and 12e.

The nMOS 12i is connected to the gates (node ND6) of the nMOSs 12a, 12b, 12c, 12d, and 12e at its gate and drain, and is connected to the power supply line VDD at its source. The inverter row 12j receives the level of the node ND1 to output the power-on resetting signal POR. The resistors R2 and R3 are connected in series VSS via the node ND6, between the power supply line VDD and the ground line.

The inactivation timing of the reset signal POR is determined based on a time from the switching-on of the power supply to the node ND1 turning to low level. Accordingly, the inactivation timing advances when the threshold voltage of the nMOS is low, and delays when the threshold voltage of the nMOS is high. The fuses 24a, 24b, 26a, and 26b shown in FIG. 3 are blown so as to turn on any one of the nMOSs 12f, 12g, and 12h, thereby decreasing a resistance between the node ND2 and the ground line VSS. This advances the inactivation timing of the reset signal POR as will be described later. Thus, in this embodiment, the SDRAM is fabricated in advance so that the reset signal POR with late inactivation timing is generated. The inactivation timing of the reset signal POR is optimally adjusted by turning on any one of the nMOSs 12f, 12g, and 12h.

Figure 5:
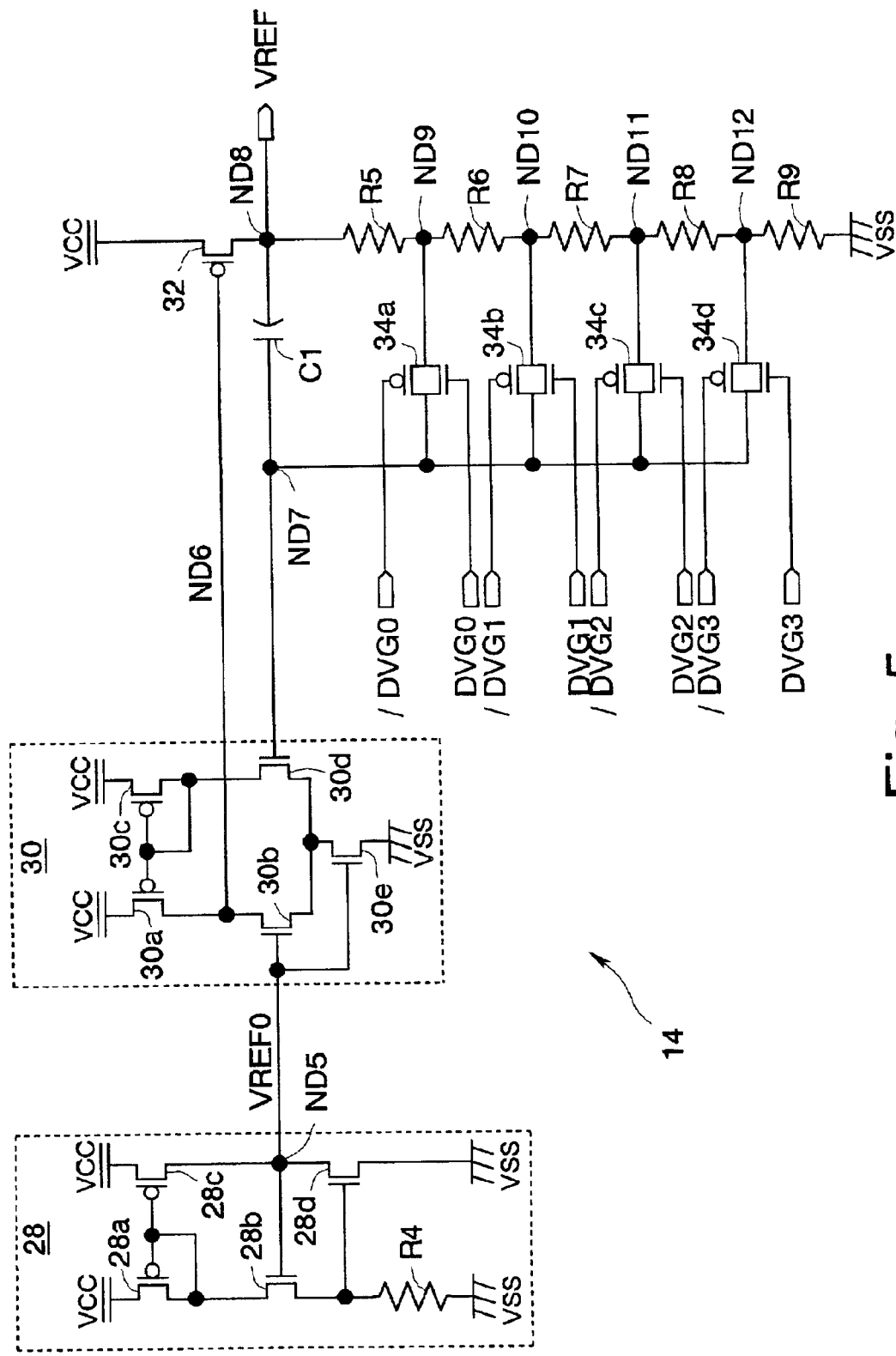
FIG. 5 is a circuit diagram showing a reference voltage generator in FIG. 2.

FIG. 5 shows the details of the reference voltage generator 14.

The reference voltage generator 14 has a voltage generator 28 which has a current mirror circuit and generates a reference voltage VREF0, a differential amplifier 30 which has a current mirror circuit and generates the reference voltage VREF, a pMOS 32, resistors R4, R5, R6, R7, R8, and R9, a capacitor C1, and CMOS transmission gates 34a, 34b, 34c, and 34d.

The voltage generator 28 includes a PMOS 28a, an nMOS 28b, and the resistor R4 which are connected in series between the power supply line VCC and the ground line VSS. The voltage generator 28 also includes, between the power supply line VCC and the ground line VSS, a PMOS 28c and an nMOS 28d which are connected in series via a node ND5, or a generation node of the reference voltage VREF0. The current mirror circuit is composed of the drain-gate-connected pMOS 28a and the PMOS 28c. The gate of the nMOS 28b is connected to the node ND5. The gate of the nMOS 28d is connected to the source of the nMOS 28b. The reference voltage VREF0 is low if the nMOSs 28b and 28d have a low threshold voltage, and is high if they have a high threshold voltage.

The differential amplifier 30 includes a pMOS 30a and an nMOS 30b connected in series, a pMOS 30c and an nMOS 30d connected in series, and an nMOS 30e for connecting the sources of the nMOSs 30b and 30d to the ground line VSS. The current mirror circuit is composed of the drain-gate-connected pMOSs 30c and 30a. An output node ND6 of the differential amplifier 30 (the drains of the pMOS 30a and the nMOS 30b) is connected to the gate of the pMOS 32. A node ND7 connected to the gate of the nMOS 30d is connected to the output node ND8 of the reference voltage VREF via the capacitor C1. The output voltage (node ND6) of the differential amplifier 30 is lower when the node ND7 falls below the reference voltage VREF0, and is higher when the node ND7 exceeds the reference voltage VREF0.

Moreover, although the inactivation timing of the reset signal POR cannot be measured, it delays as threshold voltage of the nMOS becomes higher.

The pMOS 32 and the resistors R5, R6, R7, R8, and R9 are connected in series via the nodes ND8, ND9, ND10, ND11, and ND12, between the power supply line VCC and the ground line VSS. The CMOS transmission gates 34a, 34b, 34c, and 34d establish connections from the node ND7 to the nodes ND9, ND10, ND11, and ND12, respectively. The internal supply voltage VDD is high when the reference voltage VREF is high, and is low when the reference voltage VREF is low. Therefore, the internal supply voltage VDD becomes higher when the nMOSs 28b and 28d in the voltage generator 28 have a higher threshold voltage, and becomes lower when the nMOSs 28b and 28d have a lower threshold voltage.

In this way, both the internal supply voltage VDD and the inactivation timing of the reset signal POR depend on the threshold voltage of the nMOS. The nMOSs in the power-on resetting circuit 12 and reference voltage generator 14 are fabricated in the same process so that both have the same fluctuations in threshold voltage.

The CMOS transmission gate 34a is turned on under the activation of the decoding signals DVG0 and /DVG0 (high level and low level, respectively). The CMOS transmission gate 34b is turned on upon receiving the activation of the decoding signals DVG1 and /DVG1 (high level and low level, respectively). The CMOS transmission gate 34c is turned on upon receiving the activation of the decoding signals DVG2 and /DVG2 (high level and low level, respectively). The CMOS transmission gate 34d is turned on upon receiving the activation of the decoding signals DVG3 and /DVG3 (high level and low level, respectively).

Then, one of the CMOS transmission gates 34a, 34b, 34c, and 34d is turned on, whereby the resistance division ratio determined by the resistances R5, R6, R7, R8, R9 and the node ND7 is modified to change the value of the reference voltage VREF generated.

Next, description will be given of examples where the reset signal POR is changed in inactivation timing.

Figure 6:
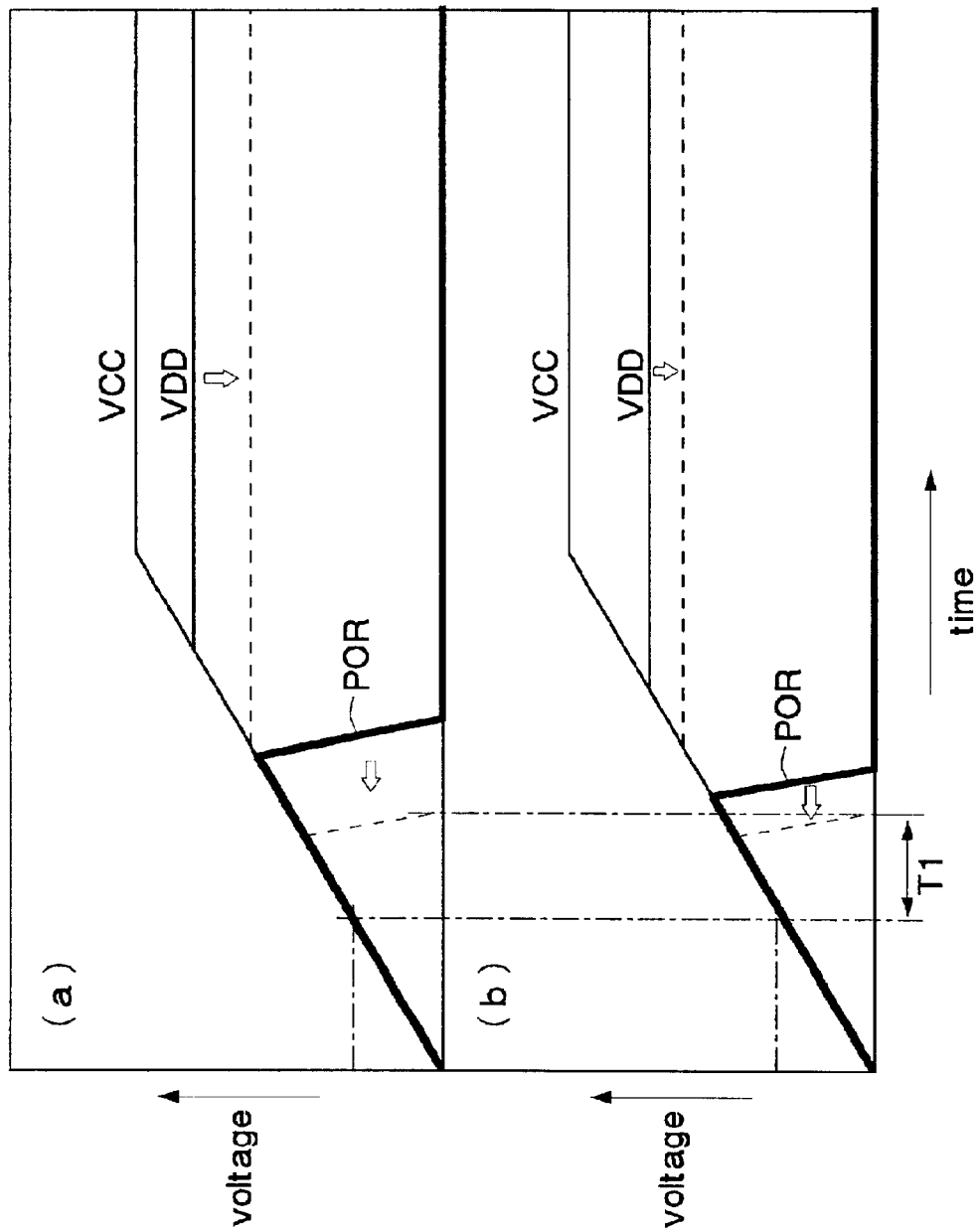
FIG. 6 is an explanatory diagram showing an example where the inactivation timing of the reset signal is changed.

FIG. 6 shows the waveforms of the external supply voltage VCC, the internal supply voltage VDD, and the reset signal POR after the turning-on of the power supply. FIG. 6(a) shows an example of the nMOS fabricated with its threshold voltage considerably higher than a standard value. FIG. 6(b) shows an example of the nMOS fabricated with its threshold voltage slightly higher than the standard value.

Initially, after SDRAM fabrication, the fuse circuit 18 shown in FIG. 3 outputs the adjusting signals RS0, RS1, VG0, and VG1 of low level as described above. Thus, the decoders 20 and 22 activate the decoding signals DRS3 and DVG3, respectively.

Then, in a probe test (test process) performed in a wafer state in which a plurality of chips are connected with each other, the internal supply voltage VDD of each chip is evaluated and the threshold voltage of the nMOS is indirectly checked. Here, the operation mode shifts to the test mode where the test activating signal TESTX is set at low level.

Then, the amount of deviation in the threshold voltage of the nMOS from the standard value is known from the amount of deviation in the internal supply voltage VDD from the standard value. That is, the reference voltage generator 14 also has the function of a monitoring circuit for threshold voltage. In FIG. 6, the solid lines indicate measured values, and the broken lines the standard value. Next, the levels of the test signals TEST0 and TEST1 are changed to activate the decoding signals DVG0–DVG3 in succession. The internal supply voltage VDD is measured in each condition, to check the levels of the test signals TEST0 and TEST1 that set the internal supply voltage VDD to the standard value shown by the broken lines.

For example, in FIG. 6(a), it is confirmed that the internal supply voltage VDD falls to the standard value when the test signals TEST0 and TEST1 are at high level and low level, respectively ("1" in binary). Here, the programming circuits 24 and 26 output the adjusting signal VG0 of low level and the adjusting signal VG1 of high level, respectively. In FIG. 6(b), it is confirmed that the internal supply voltage VDD falls to the standard value when the test signals TEST0 and TEST1 are at low level and high level, respectively ("2" in binary). Here, the programming circuits 24 and 26 output the adjusting signal VG0 of high level and the adjusting signal VG1 of low level, respectively.

From the measurement of the internal supply voltage VDD, it is indirectly confirmed that the inactivation timing of the reset signal POR shows the characteristics indicated by the solid lines in the diagram. Incidentally, in the test process, the fuses 24a, 24b, 26a, and 26b are yet to be blown. Therefore, the programming circuits 24 and 26, as described above, output the adjusting signals RS0 and RS1 of low level, respectively.

Subsequently, when, for example, the threshold voltage of the nMOS is higher, the fuses 24b and 26a respectively corresponding to the test signal TEST0 of high level and the test signal TEST1 of low level are blown in a fuse process (corresponding to FIG. 6(a)). Due to the blowing of the fuses 24b and 26a, the programming circuits 24 and 26 output the adjusting signals VG0, RS0 of low level and the adjusting signals VG1, RS1 of high level during normal operations (when the test activating signal TESTX is at high level). That is, the blowing of the fuses 24b and 26a adjusts the value of the internal supply voltage VDD and the inactivation timing of the reset signal POR at the same time.

Similarly, when, for example, the threshold voltage of the nMOS is lower, the fuses 24a and 26b respectively corresponding to the test signal TEST0 of low level and the test signal TEST1 of high level are blown in a fuse process (corresponding to FIG. 6(b)). The programming circuits 24 and 26 output the adjusting signals VG0, RS0 of high level and the adjusting signals VG1, RS1 of low level during normal operations.

As a result, the internal supply voltage VDD and the reset signal POR indicated by the broken lines in FIG. 6 are generated upon the turning-on of the power supply. That is, the reset period of the reset signal POR falls to the standard period T1.

As has been described, in the semiconductor integrated circuit of the present embodiment, the inactivation timing of the reset signal POR is changed by the timing changing circuit 10. Therefore, the inactivation timing deviating because of fluctuations in the SDRAM manufacturing conditions can be adjusted to a normal value. This consequently allows reliable initialization of the internal circuits.

The threshold voltage of the nMOS is utilized to generate the reset signal POR. Therefore, the inactivation timing of the reset signal POR can be accurately adjusted in accordance with the threshold voltage of the nMOS.

The inactivation timing of the reset signal POR can be changed by blowing the fuses 24a, 24b, 26a, and 26b.

The threshold voltage of the nMOS is utilized to generate the internal supply voltage VDD, and the inactivation timing of the reset signal POR is changed based on the internal supply voltage VDD which varies in accordance with the threshold voltage of the nMOS. This allows the adjustment of the inactive timing without direct measurement.

Even when the supply voltage VCC supplied from exterior is low, and the ratio of the threshold voltage of the transistor to the supply voltage VCC is high, the power-on resetting circuit 12 operates with reliability to generate the power-on resetting signal POR. This allows reliable initialization of the internal circuits.

The fuses 24a, 24b, 26a, and 26b to be blown for the sake of generating the reset signal POR with optimum inactivation timing are determined based on the operation of the testing circuit for changing the internal supply voltage VDD. This allows the optimum inactivation timing to be set for every chip.

The internal supply voltage VDD is adjusted to a predetermined value by blowing the fuses 24a, 24b, 26a, and/or 26b, simultaneously with the change of the inactivation timing of the reset signal POR. Therefore, the fuse circuit 18 can be shared, which reduces chip size.

Incidentally, the above-described embodiment has dealt with the case where the decoders 20 and 22 are formed corresponding to the power-on resetting circuit 12 and the reference voltage generator 14, respectively. However, the present invention is not limited to such an embodiment. For example, the decoders 20 and 22 may be shared if the inactivation timing of the power-on resetting signal POR is permitted to vary during the evaluation of the internal supply voltage VDD. This allows a reduction in chip size.

The above-described embodiment has dealt with the case where the reference voltage generator 14 is used as a monitoring circuit for threshold voltage. However, the present invention is not limited to such an embodiment. For example, the currents flowing through nMOSs for evaluation formed in a TEG (Test Element Group) on scribe lines may be measured to determine the threshold voltage. Alternatively, the threshold voltage may be determined from the oscillating period of a ring oscillator composed of nMOSs.

The above-described embodiment has dealt with the case where the present invention is applied to an SDRAM. However, the present invention is not limited to such an embodiment. For example, the present invention may be applied to FCRAMs (Fast Cycle RAMs). The present invention may also be applied to microcomputers, logic LSIs, and system LSIs.

The invention is not limited to the above embodiments and various modifications may be made without departing from the spirit and the scope of the invention. Any improvement may be made in part or all of the components.

What is claimed is:

1. A semiconductor integrated circuit comprising:
a power-on resetting circuit for activating a reset signal in response to an initial supply of a power supply to initialize an internal circuit, and for inactivating the reset signal after a predetermined period following the initial supply to terminate an initialization of the internal circuit;
a program circuit for outputting an internal signal in response to a programmed value; and
a timing changing circuit for changing an inactivation timing reset signal in accordance with said internal signal.

2. A semiconductor integrated circuit comprising:
a power-on resetting circuit for activating a reset signal in response to an initial supply of a power supply to initialize an internal circuit, and for inactivating the reset signal after a predetermined period following the initial supply to terminate an initialization of the internal circuit;
a timing changing circuit for adjusting the predetermined period in accordance with an internal signal generated in an interior of said timing changing circuit; and
a voltage generator for generating an internal supply voltage in accordance with an external supply voltage, wherein
said timing changing circuit changes an inactivation timing of the reset signal in accordance with the internal signal corresponding to said internal supply voltage.

3. The semiconductor integrated circuit according to claim 2, wherein said timing changing circuit comprises a programming circuit having a fuse for changing said inactivation timing by programming the fuse corresponding to a level of said internal supply voltage.

4. The semiconductor integrated circuit according to claim 3, further comprising a testing circuit for changing said internal supply voltage to determine said fuse to be programmed for the sake of optimizing said inactivation timing.

5. The semiconductor integrated circuit according to claim 3, wherein said internal supply voltage is adjusted to a predetermined value simultaneously with the change of said inactivation timing, by programming said fuse.

6. The semiconductor integrated circuit according to claims 2, wherein said power-on resetting circuit and said voltage generator include transistors formed through a same manufacturing process.

7. The semiconductor integrated circuit according to claim 6, wherein said transistors are nMOS transistors that have same threshold voltages.

8. A semiconductor integrated circuit comprising:
a power-on resetting circuit configured to inactivate a reset signal which initializes an internal circuit in response to a power supply being switched on, said inactivating performed in a predetermined period after activating the reset signal, and length of the predetermined period being controlled by a first adjusting signal;
a voltage generator configured to receive an external power supply voltage for generating an internal supply voltage, the level of the internal supply voltage being controlled by a second adjusting signal;
a programming circuit configured to output said first adjusting signal and said second adjusting signal; and
a signal selection circuit configured to receive an external signal, and to receive said second adjusting signal from said programming circuit, to output the external signal to said voltage generator as said second adjusting signal in response to a test mode signal.

9. The semiconductor integrated circuit according to claim 8, wherein said signal selection circuit includes a mask circuit for masking an output from said programming circuit and for outputting said external signal as said second adjusting signal, in response to said test mode signal which is activated during a testing mode.

10. The semiconductor integrated circuit according to claim 8, wherein said programming circuit includes fuses configured to program the logical values of said first adjusting signal and said second adjusting signal.

11. The semiconductor integrated circuit according to claims 8, wherein said power-on resetting circuit and said voltage generator include transistors formed through a same manufacturing process.

12. The semiconductor integrated circuit according to claim 11, wherein said transistors are nMOS transistors that have same threshold voltages.

* * * * *